United States Patent [19]
Nishizono et al.

[11] Patent Number: 5,804,997
[45] Date of Patent: Sep. 8, 1998

[54] CURRENT-TO-VOLTAGE CONVERTING DEVICE AND LIGHT RECEIVER

[75] Inventors: Kazunori Nishizono; Tetsuji Funaki; Atsushi Hayakawa, all of Kawasaki, Japan

[73] Assignee: Fujitsu Limited, Kawasaki, Japan

[21] Appl. No.: 621,091

[22] Filed: Mar. 22, 1996

[30] Foreign Application Priority Data

Sep. 19, 1995 [JP] Japan ..................................... 7-240262
Oct. 2, 1995 [JP] Japan ..................................... 7-255234

[51] Int. Cl.⁶ .................................................. H02M 11/00
[52] U.S. Cl. .............................. 327/103; 327/72; 327/73; 327/167; 327/187
[58] Field of Search ........................... 327/103, 165–168, 327/72, 73, 514, 187, 334, 336, 341, 344, 362, 363, 560–563; 250/214 R

[56] References Cited

U.S. PATENT DOCUMENTS

| | | | |
|---|---|---|---|
| 4,263,520 | 4/1981 | Kajihata et al. | 327/72 |
| 4,481,675 | 11/1984 | Ichikawa et al. | 327/165 |
| 4,625,320 | 11/1986 | Butcher | 327/165 |

FOREIGN PATENT DOCUMENTS

| | | | |
|---|---|---|---|
| 3033565 | 4/1981 | Germany | 327/165 |
| 57-61330 | 4/1982 | Japan | 327/167 |
| 4-049739 | 2/1992 | Japan . | |

Primary Examiner—Kenneth B. Wells
Attorney, Agent, or Firm—Staas & Halsey

[57] ABSTRACT

A device for converting a current pulse signal into a voltage pulse signal through a conversion from a current to a voltage includes a converting unit converting the current pulse signal into a first voltage signal, a voltage reducing unit generating a second voltage signal by reducing a magnitude of the first voltage signal, a delay unit generating a third voltage signal by delaying the second voltage signal, and a comparison unit generating the voltage pulse signal by comparing the first voltage signal with the third voltage signal.

10 Claims, 21 Drawing Sheets

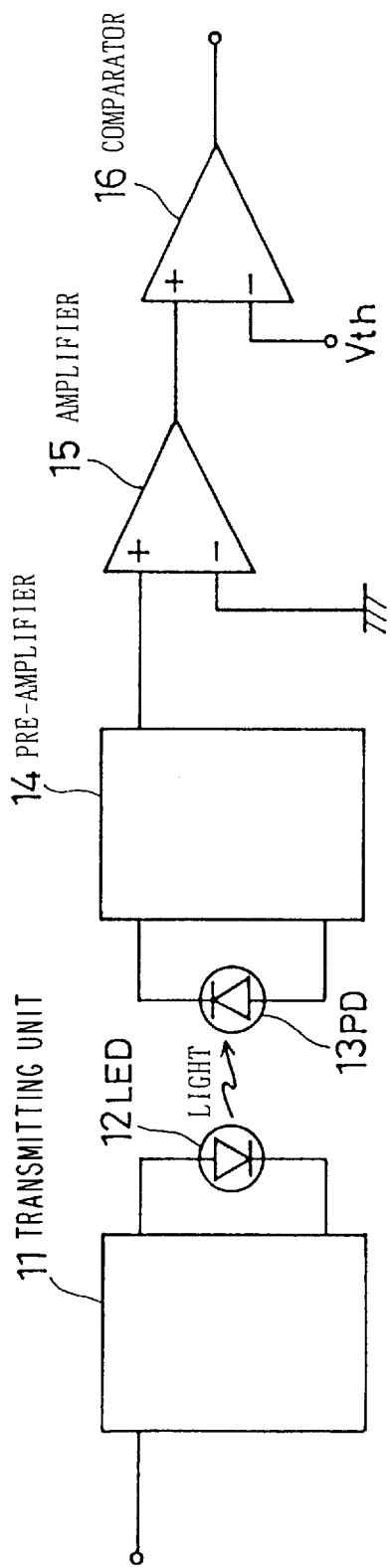

FIG. 5
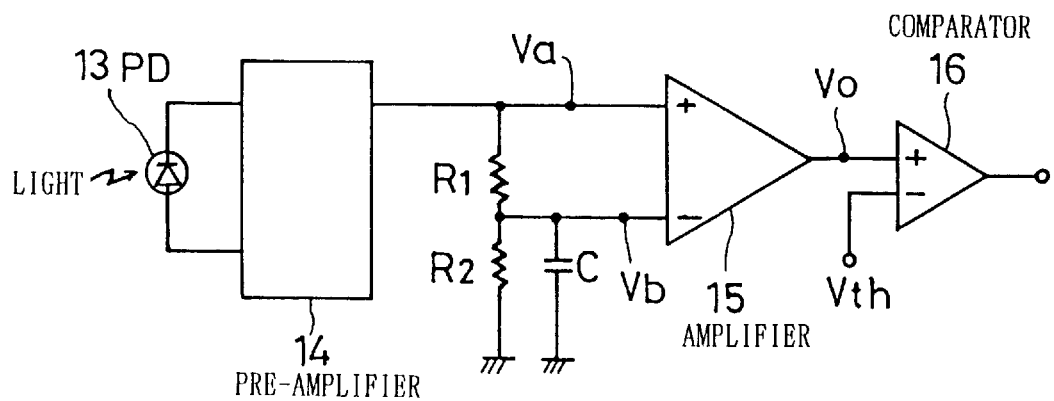
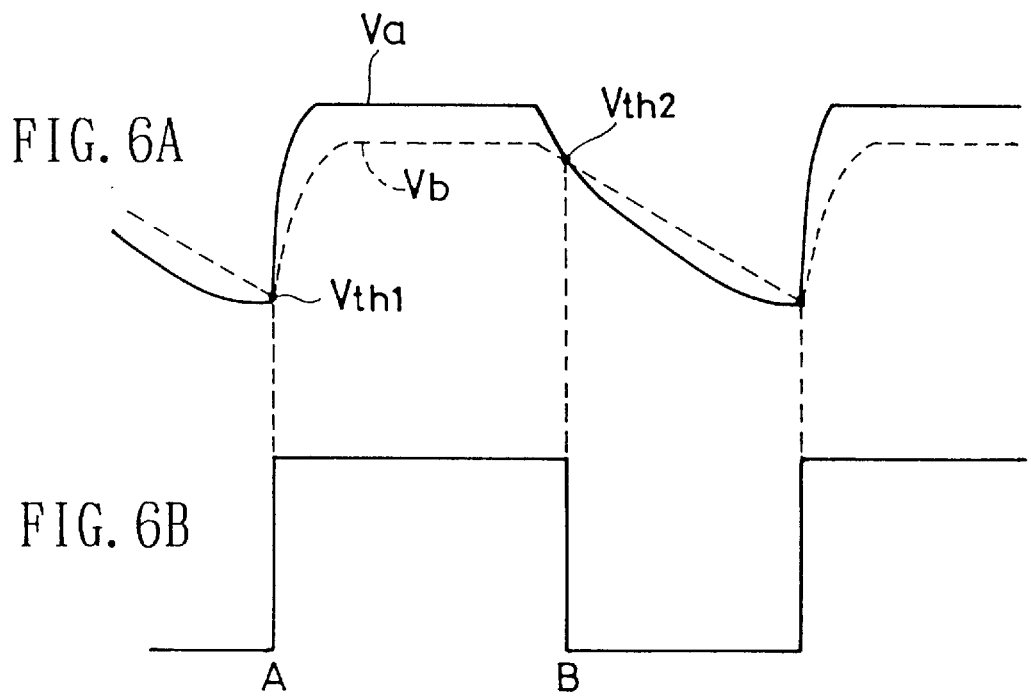

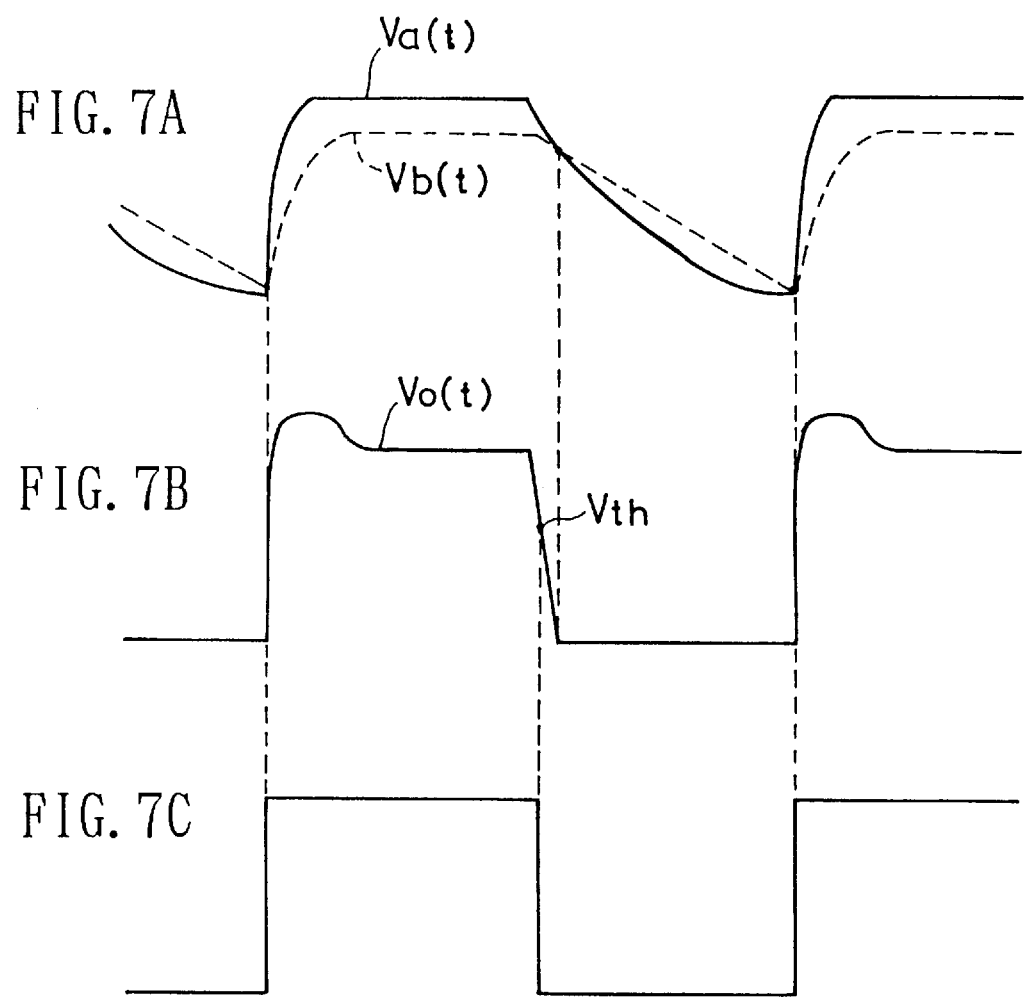

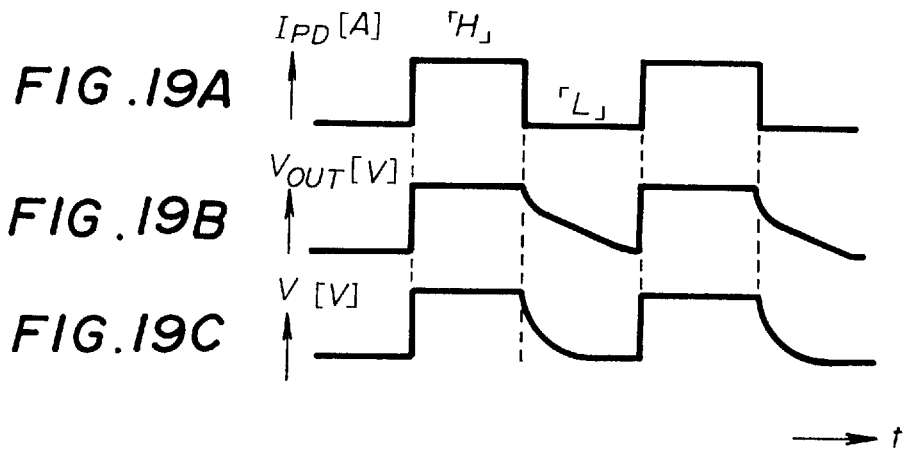
FIG. 19A
FIG. 19B
FIG. 19C
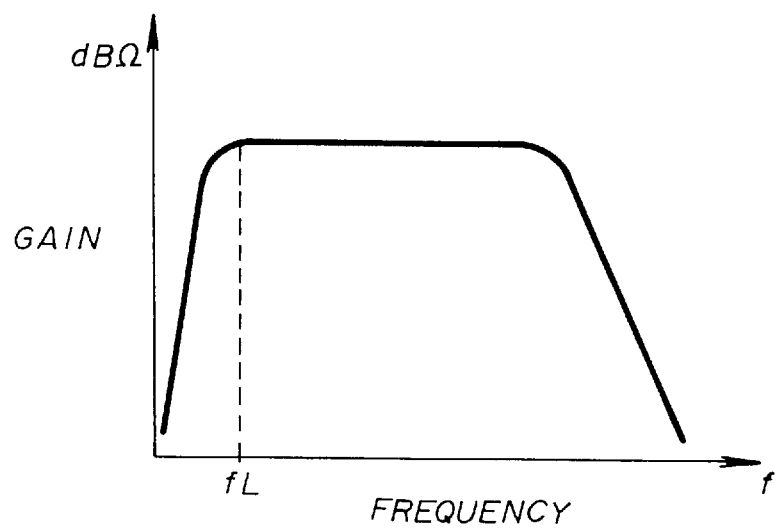
FIG. 20

CURRENT-TO-VOLTAGE CONVERTING DEVICE AND LIGHT RECEIVER

BACKGROUND OF THE INVENTION

1. Field of the Invention

The present invention generally relates to light receiving devices, and particularly relates to a device for receiving an optical pulse signal and converting it into a voltage pulse signal.

2. Description of the Prior Art

The optical transmission technique is widely used for transmitting signals, and there is a high demand for inexpensive optical transmission devices having a large transmission capacity. A light transmitter on the transmission side sends optical pulse signals after converting voltage pulse signals into the optical pulse signals. A light receiver on the receiving side receives the optical pulse signals, and converts them into voltage pulse signals.

FIG. 1 is a circuit diagram of an example of a related-art optical transmission device. The optical transmission device of FIG. 1 includes a transmitter and a receiver. The transmitter includes a transmitting unit 11 and a LED (light emission diode) 12. The receiver includes a PD (photo diode) 13, a pre-amplifier 14, an amplifier 15, and a comparator 16.

FIGS. 2A through 2E are time charts showing wave forms of signals observed at various points of FIG. 1 Provided with an input voltage signal as shown in FIG. 2A, the transmitting unit 11 applies a current as shown in FIG. 2B to the LED 12. The LED 12 emits light to send an optical signal, which is then received by the PD 13. At this time, a current as shown in FIG. 2C is generated through the PD 13. The pre-amplifier 14, which is an I-V converter to convert a current into a voltage signal, generates an output voltage signal as shown in FIG. 2D The voltage signal of FIG. 2D is then amplified by the amplifier 15 before the comparator 16 compares the amplified signal with an appropriate threshold value Vth. As a result, a voltage pulse signal as shown in FIG. 2E is obtained.

As shown in FIG. 2D, the output signal of the pre-amplifier 14 is not precisely a pulse signal because of the resistor and the capacitor included in the PD 13. In order to explain this, a simple model circuit of the pre-amplifier 14 and the PD 13 connected thereto is shown in FIG. 3A with the capacitor of the PD 13 separately shown. The model circuit of the pre-amplifier 14 in this figure is a simplified circuit only to explain a basic principle of the pre-amplifier.

In FIG. 3A, the pre-amplifier 14 includes a resistor 21 and a Schottky diode 22, and the PD 13 includes a PD 23 and a capacitor 24. Here, Vcc denotes a power voltage. When an optical signal as shown in FIG. 3B is received by the PD 23, a current commensurate with this optical signal would flow through the PD 23 if there were no capacitor 24. However, the existence of the capacitor 24 delays a rise and a fall of the voltage appearing at the output node of the pre-amplifier 14. As a result, a voltage shown by a solid line in FIG. 3C is obtained at an output of the pre-amplifier 14.

A signal shown by a dashed line in FIG. 3C is a voltage which would appear at the output node of the pre-amplifier 14 if there were no Schottky diode 22 in FIG. 3A. In reality, the Schottky diode 22 of the pre-amplifier 14 clamps the output voltage, thereby providing the voltage signal shown by the solid line in FIG. 3C.

Because of the reason described above, the output signal of the pre-amplifier 14 shown in FIG. 2D does not properly reflect the transmitted signal. Therefore, the output signal of the comparator 16 (FIG. 2E) obtained through a comparison with a threshold value has a pulse length longer than that of the transmitted signal. Even if the signal shown in FIG. 2D is deformed, there is little problem when the pulse length of the transmitted signal is relatively long, i.e., when T is far greater than Te. However, when the pulse length is shortened such that T/2 is less than Te, a difference in the pulse length between the transmitter side and the receiver side becomes undesirably large. In such a case, a problem arises when a modulation scheme representing 0's and 1's using the pulse length is employed.

FIG. 4 is an enlarged view of the output signal of the pre-amplifier 14 shown in FIG. 2D In the voltage signal form of FIG. 4, the effect of the Te portion can be minimized if the threshold voltage can be set to a voltage Vr slightly lower than the maximum voltage Vh. Namely, even if the pulse length is shortened on the transmitter side, a voltage pulse signal having a similar pulse length can be obtained on the receiver side.

Although it is preferable to use a threshold voltage slightly lower than the maximum voltage Vh, it is very difficult to set such a threshold voltage due to voltage fluctuation or the like. The above description has been provided, for the sake of simplicity of explanation, by considering a threshold value for the output signal of the pre-amplifier 14. In reality, however, the amplifier 15 amplifies the signal before the comparator 16 compares it with the threshold value.

A photo diode used as the PD 13 ranges from an expensive one having a capacity of an order of picofarads to an inexpensive one having a capacity of an order of several tens of picofarads. When a pulse frequency of a transmitted optical signal becomes several tens of megahertz or higher, the expensive photo diode having a capacity of an order of picofarads should be used, resulting in higher prices of the optical transmission devices. This is not desirable for optical transmission devices which are mass-manufactured and used in the general-purpose computer communication.

Accordingly, there is a need for a light receiver which can reconstruct a voltage signal having a pulse length similar to that on the transmitter side in order to achieve a high-speed optical transmission.

SUMMARY OF THE INVENTION

Accordingly, it is a general object of the present invention to provide a light receiver which can satisfy the need described above.

It is another and more specific object of the present invention to provide a light receiver which can reconstruct a voltage signal having a pulse length similar to that on the transmitter side in order to achieve a high-speed optical transmission.

In order to achieve the above objects according to the present invention, a device for converting a current pulse signal into a voltage pulse signal through a conversion from a current to a voltage includes a converting unit converting the current pulse signal into a first voltage signal, a voltage reducing unit generating a second voltage signal by reducing a magnitude of the first voltage signal, a delay unit generating a third voltage signal by delaying the second voltage signal, and a comparison unit generating the voltage pulse signal by comparing the first voltage signal with the third voltage signal.

According to the present invention, the first voltage signal is reduced in magnitude by the voltage reducing unit to generate the second voltage signal. Then, the second voltage signal is delayed by the delay unit to generate the third voltage signal. Thus, the third voltage signal has a reduced magnitude and a time delay, and can serve as an appropriate threshold voltage for the trailing edge of the first voltage signal. The comparison unit compares the first voltage signal with the third voltage signal to generate the voltage pulse signal. As a result, the voltage pulse signal has a pulse length almost the same as that of the current pulse signal.

Other objects and further features of the present invention will be apparent from the following detailed description when read in conjunction with the accompanying drawings.

BRIEF DESCRIPTION OF THE DRAWINGS

FIG. 1 is a circuit diagram of an example of a prior-art optical transmission device;

FIG. 5 is a circuit diagram of a light receiver according to a first embodiment of the present invention;

FIGS. 6A and 6B are illustrative drawings showing the principle of the present invention;

FIGS. 7A through 7C are illustrative drawings showing signal forms at various points in FIG. 5;

FIGS. 19A through 19C are time charts for showing an improved result of the fifth embodiment of the present invention;

FIG. 20 is a chart showing a frequency characteristic of the light receiver of the fifth embodiment;

DESCRIPTION OF THE PREFERRED EMBODIMENTS

Figure 2A:
FIGS. 2A through 2E are time charts showing wave forms of signals observed at various points of FIG. 1.
Figure 2B:
Figure 2C:

In the following, embodiments of the present invention will be described with reference to the accompanying drawings.

FIG. 5 is a circuit diagram of a light receiver according to a first embodiment of the present invention. In FIG. 5, the same elements as those of FIG. 1 are referred to by the same numerals, and a description thereof will be omitted. The light receiver of FIG. 5 may be implemented in a semiconductor integrated circuit. Also, use of the circuit of FIG. 5 is not limited to a light receiver. This circuit may be used in any devices where there is a need for such a circuit.

The light receiver of FIG. 5 includes the PD 13, the pre-amplifier 14, the amplifier (differential amplifier) 15, resistors R1 and R2, and a capacitor C. In the circuit of FIG. 5, an output voltage Va of the pre-amplifier 14 is divided by a voltage dividing circuit comprising the resistor R1 and R2 to generate a voltage Vb in a stable state.

$$Vb = Va \cdot R2/(R1+R2) \tag{1}$$

Since the capacitor C is provided in a parallel connection with the resistor R2, the voltage Vb contains a time delay compared to the voltage Va in a transient state. Namely, a signal form of the voltage Vb is delayed from a signal form of the voltage Va after multiplying the voltage Va by $R2/(R1+R2)$.

In principle, the present invention generates a voltage pulse signal by using as a threshold value a signal form obtained by delaying a voltage signal having a reduced amplitude (reduced by a factor of $R2/(R1+R2)$). FIGS. 6A and 6B are illustrative drawings showing the principle of the present invention. A solid line in FIG. 6A shows a signal form of the output voltage Va of the pre-amplifier 14. A dashed line shows a signal form of the voltage Vb, having a reduced magnitude and a time delay. Using a voltage signal of the dashed line as a threshold value for the voltage signal of the solid line, a threshold value Vth1 is obtained at a time A, and a threshold value Vth2 is obtained at a time B. Thus, the voltage of the solid line exceeds the threshold voltage (dashed line) only during a period between the time A and the time B. As a result, a voltage pulse signal staying at a high level during the period from the time A to the time B is obtained as shown in FIG. 6B.

In the circuit of the first embodiment shown in FIG. 5, a signal form of the voltage Vb is represented as:

$$Vb(t) = R2/(R1+R2) \cdot Va(t) \cdot (1-e^{-t/CR}) \tag{2}$$

where $R = R1 \cdot R2/(R1+R2)$. That is, the signal form of the voltage Vb has a charge-and-discharge curve having a time constant $tc = CR$. In the circuit of FIG. 5, the voltage Va(t) and the voltage Vb(t) are applied to the input nodes of the amplifier 15. The amplifier 15 obtains a signal form representing a difference between the signal form of the voltage Va and the voltage Vb. FIGS. 7A through 7C are illustrative drawings showing these signal forms as well as a resulting voltage pulse signal.

In FIG. 7A, the voltage Va(t) is shown by a solid line, and the voltage Vb(t) is shown by a dashed line. FIG. 7B shows an output voltage Vo(t) of the amplifier 15. As shown in FIG. 7B, the output voltage Vo(t) of the amplifier 15 is a difference between Va(t) and Vb(t), and, thus, has little tapering off at a trailing edge of the pulse. In FIG. 7B, a magnitude immediately after a forward edge of a pulse is not shown as large as an actual difference between Va(t) and Vb(t). This is because of a saturation of the amplifier 15.

A voltage pulse signal shown in FIG. 7C is obtained by using the comparator 16 to compare the voltage signal Vo(t) of FIG. 7B with an appropriate threshold value Vth. The voltage pulse signal of FIG. 7C has a pulse length almost the same as that of the transmitted optical pulse signal. Here, since the trailing edge of the voltage signal Vo(t) of FIG. 7B is steep, the voltage of the threshold value Vth is not critical for the resulting pulse length, and, thus, is easy to set.

As described in the above, the use of the light receiver of FIG. 5 allows generation of the voltage pulse signal having a pulse length almost the same as that of the transmitted pulse signal. In the present invention, the voltage Vb(t) is used as a threshold value for the voltage Va(t), and the amplifier 15 far amplifying the difference between two input signals principally serves as a comparator. Thus, the process of amplifying the difference between the voltage Va(t) and the voltage Vb(t) using the amplifier 15 can be regarded as a process of modifying the pulse length based on the threshold value Vb(t) as well as amplifying the signal.

Figure 8:
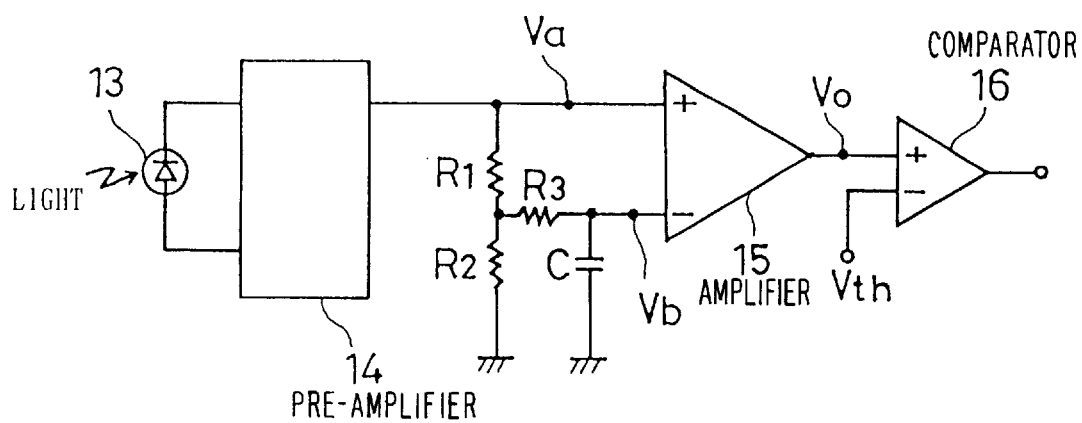
FIG. 8 is a circuit diagram of a light receiver according a second embodiment of the present invention.

FIG. 8 is a circuit diagram of a light receiver according a second embodiment of the present invention. In FIG. 8, the same elements as those of FIG. 5 are referred to by the same numerals, and a description thereof will be omitted.

The light receiver of FIG. 8 is provided with a resistor R3 connected in series with the capacitor C of the light receiver of FIG. 5. The register R3 is added to adjust the time constant tc (=CR) of the equation (2).

Figure 9:
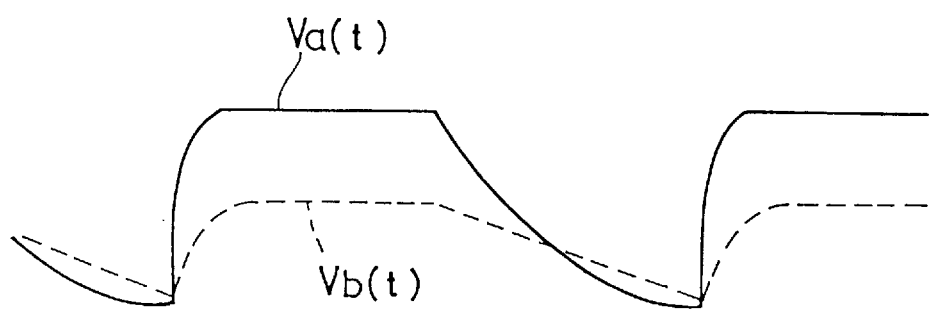
FIG. 9 is an illustrative drawing for explaining a case in which a resulting pulse length becomes undesirably large.

In order to adjust the time constant tc to obtain an appropriate output signal Vo(t) (FIG. 7B) in the light receiver of FIG. 5, the resistances of the resistors R1 arid R2 may be modified. However, it is not preferable to change the resistor R1 or R2 since the change brings about a change in the ratio of the voltage division R2/(R1+R2). For example, if R1 is excessively increased, the magnitude of the voltage Vb(t) is reduced as shown in FIG. 9 such that a resulting pulse length is undesirably large.

On the contrary, even when the resistor R3 is changed for an adjustment in FIG. 8, the magnitude of the voltage Vb(t) remains at R2/(R1+R2). In this case, the time constant is equal to C(R+R3), and, thus, it is possible to change the time constant tc linearly without changing the magnitude of the voltage Vb.

Accordingly, in the light receiver according to the second embodiment of the present invention, a change in the resistor R3 enables an easy adjustment of the time constant tc so as to obtain an appropriate pulse length.

Figure 10:
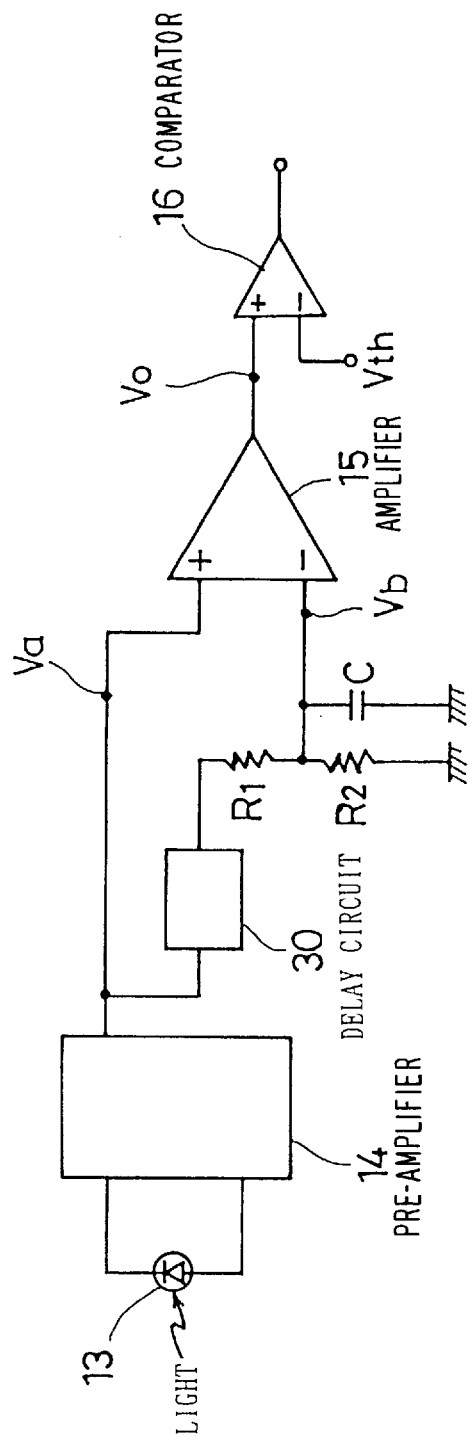
FIG. 10 is a circuit diagram of a light receiver according a third embodiment of the present invention.

FIG. 10 is a circuit diagram of a light receiver according a third embodiment of the present invention. In FIG. 10, the same elements as those of FIG. 5 are referred to by the same numerals, and a description thereof will be omitted.

The light receiver of FIG. 10 is provided with a delay circuit 30 in addition to the light receiver of FIG. 5. The delay circuit 30 is comprised of a buffer amplifier, for example. The delay circuit 30 delays the voltage signal Vb(t) by a time length Td as shown by a dashed line in FIG. 11A. The voltage signal Vb(t) I of FIG. 11A has a starting point Ds of a trailing edge delayed by the time length Td. Therefore, a difference between the voltage signal Va(t) and the voltage signal Vb(t) changes more rapidly than in the light receiver of FIG. 5 (the voltage signal of FIG. 7A) at an intersection of these two voltage signals.

Figure 11:
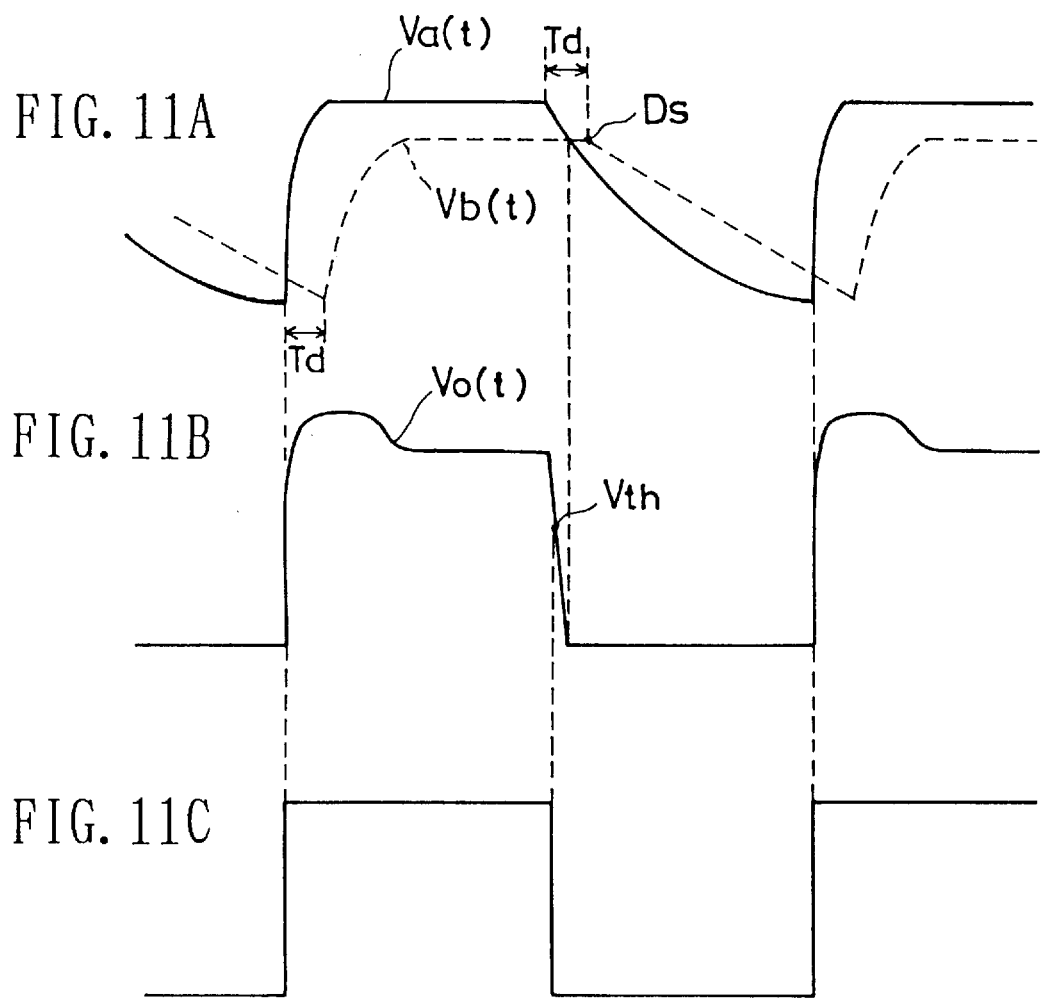
FIGS. 11A through 11C are illustrative drawings showing signal forms at various points in FIG. 10.

FIG. 11B shows a voltage signal obtained after the amplifier 15 amplifies the difference between the voltage signal Va(t) and the voltage signal Vb(t) of FIG. 11A. Because of the reason described above, the voltage signal of FIG. 11B output from the amplifier 15 has a more steep trailing edge than does the voltage signal Vo(t) of FIG. 7B. Thus, an output signal (FIG. 11C) obtained after the comparator 16 compares Vo(t) with the threshold value Vth has a pulse length closer to the original pulse length of the transmitted optical pulse signal.

Accordingly, in the light receiver according to the third embodiment of the present invention, the use of the delay circuit 30 enables a generation of the voltage signal having a pulse length closer to the original pulse length of the transmitted optical pulse signal.

Figure 12:
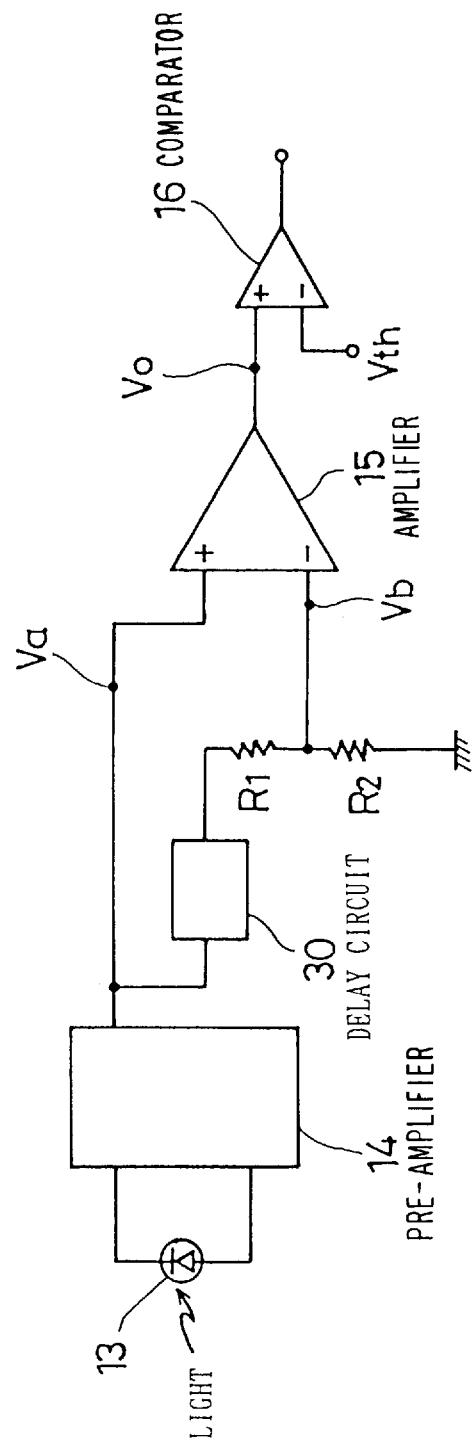
FIG. 12 is a circuit diagram of a light receiver of an alternate configuration according to the third embodiment of the present invention.

FIG. 12 is a circuit diagram of a light receiver of an alternate configuration according to the third embodiment of the present invention. In FIG. 12, the capacitor C of FIG. 10 is non-existent.

As previously described, the principle of the present invention is to generate a voltage signal having a smaller magnitude through a voltage division and to delay this voltage signal to use it as a threshold voltage. Thus, contrary to the use of both the capacitor C and the delay circuit 30, either one of them can be used as a delay element to embody the present invention. In FIG. 12, the delay circuit 30 serves as a delay element as does the capacitor C in FIG. 5, so that a result similar to that of the light receiver of FIG. 5 can be obtained.

Figure 13:
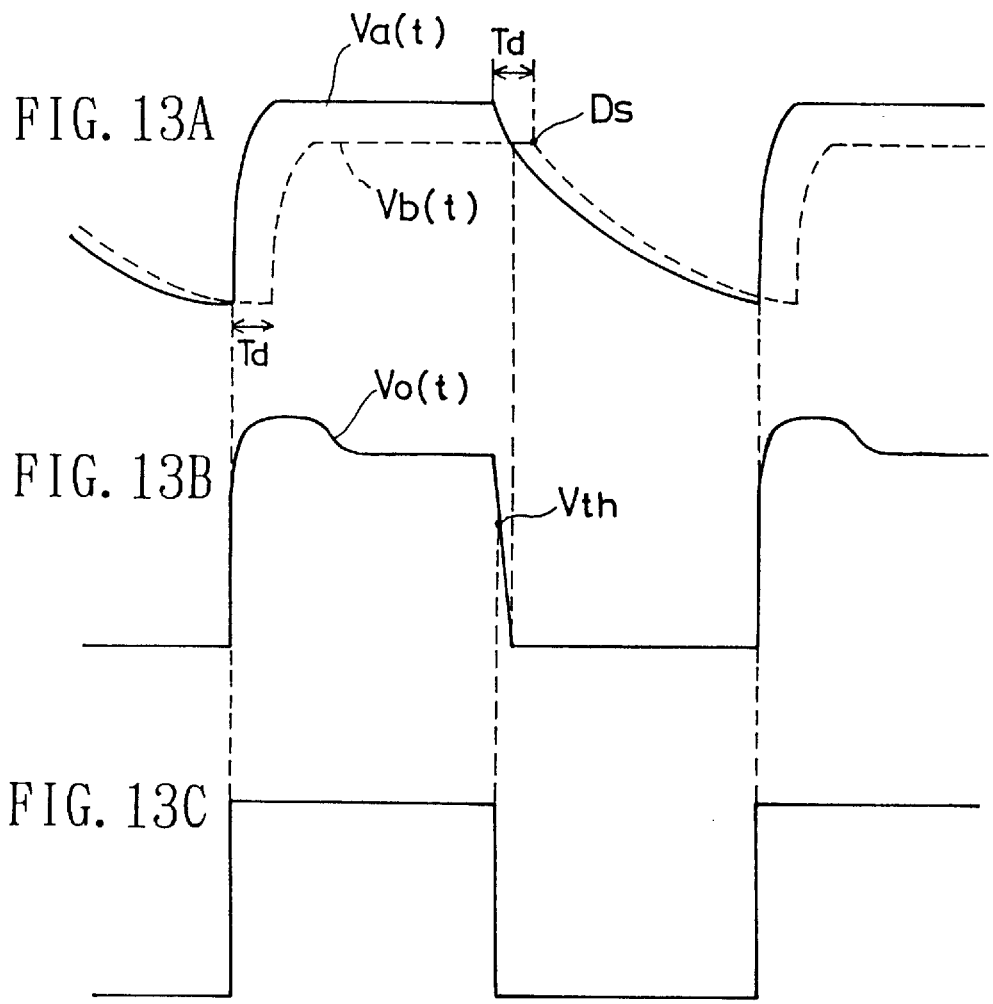
FIGS. 13A through 13C are illustrative drawings showing voltage signals concerning the light receiver of FIG. 12.

FIG. 13A through 13B are illustrative drawings showing voltage signals concerning the light receiver of FIG. 12. In FIG. 13A, a voltage signal Va(t) output from the pre-amplifier 14 is shown by a solid line, and a voltage signal Vb(t) having experienced a time delay and a voltage division is shown by a dashed line. In this case, the delay circuit 30 must have a time delay Td sufficiently long for Vb(t) to cross Va(t) at its trailing edge. In FIG. 13B is shown a voltage signal obtained after the amplifier 15 amplifies a difference between the voltage signal Va(t) and the voltage signal Vb(t). In FIG. 13C is shown a voltage signal obtained after the comparator 16 compares the voltage signal of FIG. 13B with a threshold voltage Vth.

As shown in the alternate configuration of the third embodiment, a delay circuit comprised of a buffer amplifier or the like, instead of a capacitor, can be used as a delay element. In the same manner as in the use of a capacitor, the light receiver can generate a voltage signal having a pulse length almost the same as that of the transmitted optical pulse signal.

Figure 14:
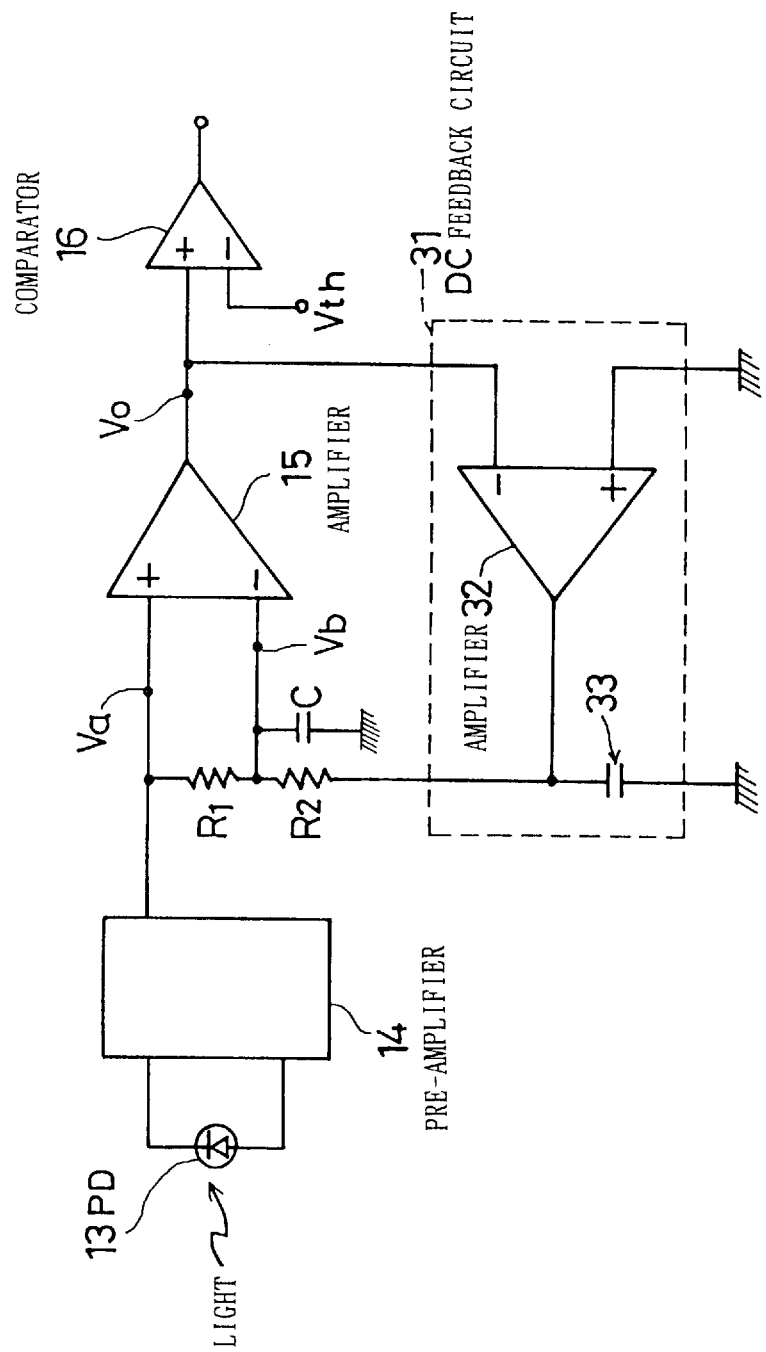
FIG. 14 is a circuit diagram of a light receiver according a fourth embodiment of the present invention.

FIG. 14 is a circuit diagram of a light receiver according a fourth embodiment of the present invention. In FIG. 14, the same elements as those of FIG. 5 are referred to by the same numerals, and a description thereof will be omitted.

Figure 15A:
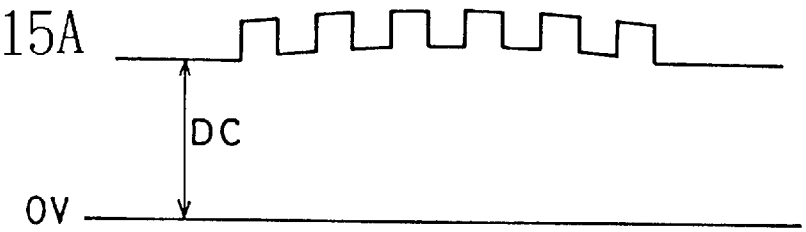
FIGS. 15A and 15B are illustrative drawings for explaining an improved result owing to the addition of a DC feedback circuit of FIG. 14.
Figure 15B:
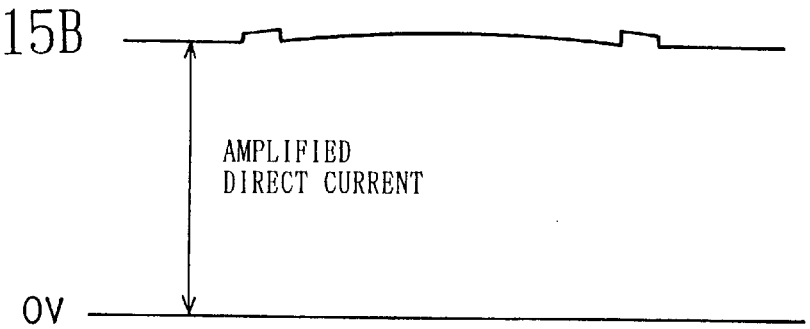

The light receiver of FIG. 14 is provided with a DC (direct current) feedback circuit 31 in addition to the light receiver of FIG. 5. FIGS. 15A and 15B are illustrative drawings for explaining an improved result owing to the addition of the DC feedback circuit 31. FIG. 15A shows a difference in the voltage between the two inputs of the amplifier 15. Here, it is assumed that a dark current of a photo diode having a magnitude Dc and an unnecessary low frequency component owing to an external disturbance are included in the signal of FIG. 15A. FIG. 15B shows a signal obtained after the amplifier 15 amplifies the voltage signal of FIG. 15A.

An output of the amplifier 15 saturates at a certain voltage. Thus, when there is a DC component and/or low frequency components with a relatively large magnitude compared to signal components as shown in FIG. 15A, the signal components are buried in the DC component and/or the low frequency components after the amplification is shown in FIG. 15B. This is because the DC component and the low frequency components are amplified such that the output voltage reaches a saturating level. As a result, the signal components only appear as a voltage fluctuation around the saturating level.

In order to obviate this problem, the light receiver of FIG. 14 is provided with the DC feedback circuit 31 to cancel out the DC component and/or the low frequency components applied between the two inputs of the amplifier 15. The DC feedback circuit 31 includes an amplifier 32 and a capacitor 33. A technique to cancel out a DC component and low frequency components by using such a DC feedback circuit is well known, and a description thereof will be omitted.

In the light receiver according to the fourth embodiment of the present invention, the DC feedback circuit 31 cancels out a DC component and/or low frequency components, preventing signal components from being buried in the DC component and/or the low frequency components. Therefore, the light receiver can generate a voltage signal having a pulse length almost the same as that of the transmitted optical pulse signal.

According to the present invention, a voltage signal output from the current-to-voltage converting unit is reduced in magnitude by the voltage dividing unit, and, then, is delayed by the delay unit to generate a delayed-voltage signal. Thus, the delayed-voltage signal has a reduced magnitude and a time delay, and can serve as an appropriate threshold voltage at the trailing edge of the voltage signal. The comparison unit compares the voltage signal with the delayed-voltage signal to generate a voltage pulse signal. As a result, the voltage pulse signal output from the device has a pulse length almost the same as that of a current pulse signal input to the device.

Also, according to the present invention, a difference between the voltage signal and the delayed-voltage signal is amplified and, then, is compared with a predetermined threshold voltage to generate a voltage pulse signal. Thus, the voltage pulse signal having a pulse length almost the same as that of the current pulse signal is obtained.

Also, according to the present invention, the voltage dividing unit used for obtaining a voltage pulse signal having a pulse length almost the same as that of the current pulse signal may be comprised of resistors arranged in series.

Also, according to the present invention, the delay unit used for obtaining a voltage pulse signal having a pulse length almost the same as that of the current pulse signal may be comprised of a capacitor.

Also, according to the present invention, the capacitor is connected in parallel to one of the resistors, so that the delayed-voltage signal has a time delay corresponding to charging/discharging characteristics of the capacitor.

Also, according to the present invention, an additional resistor is provided in series to the capacitor, so that the time constant controlling the shape of the delayed-voltage signal is easily adjusted.

Also, according to the present invention, a delay circuit may be used as the delay unit to obtain the voltage pulse signal having a pulse length almost the same as that of the current pulse signal.

Also, according to the present invention, the delay unit may be provided between the current-to-voltage converting unit and the voltage dividing unit.

Also, according to the present invention, a delay circuit may be used for obtaining a delayed-voltage signal having a steeper trailing edge. Therefore, the voltage pulse signal having a pulse length closer to that of the current pulse signal is obtained.

Also, according to the present invention, a DC offset of the differential amplifier can be canceled by using a DC feedback technique. Thus, signal components are not buried in the DC component at the output of the differential amplifier.

Moreover, there is another problem relating to the present invention as will be described below.

In recent years, various devices for optical communication have been developed, using light receivers for -receiving light and for outputting a voltage signal. In such devices, a current-to-voltage converting circuit is required for converting received light signal into a voltage signal. These devices are used on power voltages ranging from that provided on a commercial power line to that provided on a battery. Therefore, circuits capable of operating on a wide range of power voltages and capable of outputting a voltage having a wide dynamic range are demanded.

Figure 16:
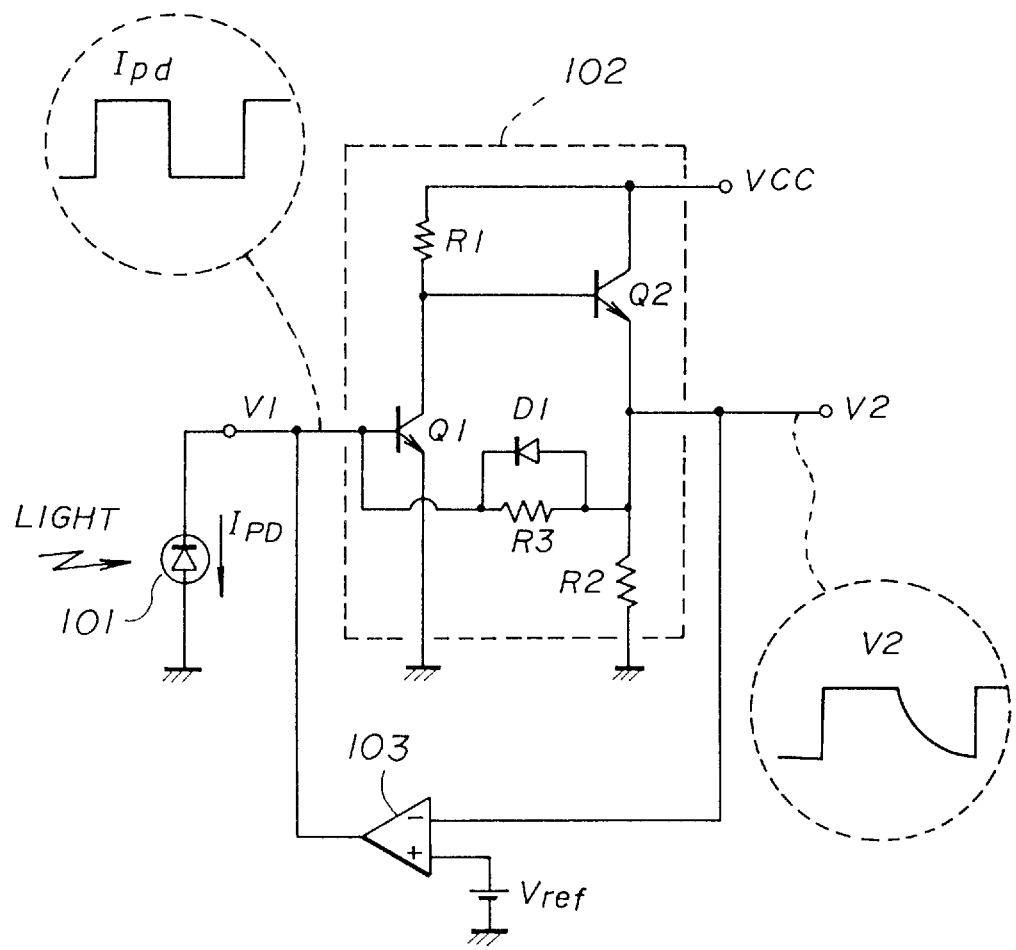
FIG. 16 is a circuit diagram of the light receiver of the related art.

FIG. 16 is a circuit diagram of the light receiver of the related art. In FIG. 16, the light receiver includes a light receiving device 101, a current-to-voltage converting circuit 102, and a DC-voltage-feedback circuit 103. The light receiving device 101 receives light such as infrared light to generate a current. A photo diode may be used as the light receiving device 101. The current-to-voltage converting circuit 102 converts the current generated by the light receiving device 101 into a voltage. The current-to-voltage converting circuit 102 includes npn-type bipolar transistors Q1 and Q2, a diode D1, and three resistors R1 through R3.

The collector of the transistor Q1 is connected to the base of the transistor Q2 and to a power voltage VCC via the resistor R1. The base of the transistor Q1 is coupled to the light receiving device 101, to the cathode of the diode D1, and to one end of the resistor R3. The emitter of the transistor Q1 is connected to the ground.

The collector of the transistor Q2 is coupled to the power voltage VCC. The emitter of the transistor Q2 is connected to the ground via the resistor R2, tc the other end of the resistor R3, to the anode of the diode D1, and to an output node to generate a voltage V2. Here, the resistor R2 is called a trans-impedance.

The diode D1 is used for clamping a voltage fall through the resistor R3. The diode D1 is turned on when a current Ipd flowing through the light receiving device 101 becomes large. The turn-on condition of the diode D1 is when the voltage fall of the resistor R3 exceeds a voltage fall VF of the diode D1 in a forward direction. When the diode D1 is turned on, a current flows into the light receiving device 101 from the transistor Q2. Thus, the base voltage of the transistor Q1 is fixed to prevent a rise in the collector voltage.

The DC-voltage-feedback circuit 103 feeds back the voltage V2 from the output of the current-tovoltage converting circuit 102 to the input thereof. The DC-voltage-feedback circuit 103 comprises a differential amplifier, and controls the input voltage of the transistor Q1 such that the output voltage V2 becomes equal to a reference voltage Vref.

In the following, an operation of the light receiver will be described. As previously described, the light receiving device 101 generates the current Ipd when receiving light. Thus, when light repeatedly switching between on and off is received, the current Ipd becomes a high level (H) or a low level (L) according to the on and off state of the light.

When the current Ipd is not generated, the input voltage VT1 and the output voltage V2 have the same DC voltage (Vbe). This is because the current-to-voltage converting circuit 102 forms a feedback circuit with the transistors Q1 and Q2 and the resistors R1 and R2. When the current Ipd is generated, the output voltage V2 of the current-to-voltage converting circuit 102 has a voltage change equal to a current change in Ipd multiplied by R3. In this manner, the current-to-voltage conversion is carried out by using the resistor R3 as a trans-impedance.

When the voltage fall through the resistor R3 exceeds the forward-direction voltage fall VF of the diode D1 due to a large amount of the current Ipd, the diode D1 is turned on to make a current flow from the transistor Q2 into the light receiving device 101. In this manner, the transistor Q1 is clamped.

The DC-voltage-feedback circuit 103 also serves to cancel an offset current, which may be generated by a leak current of the light receiving device 101 and/or an ambient light received along with the light signal.

As described above, the current-to-voltage converting circuit 102 has the diode D1 connected in parallel with the resistor R3 to clamp the transistor Q1. This creates problems as follows.

1) When the current Ipd changes from the high level to the low level, the output voltage V2 has a trail tapering off as shown in the dashed circle of FIG. 16. This is because of a capacitor included in the light receiving device 101 and of electric discharge of the diode D1. Charge is accumulated in the diode D1 after the current flows into the light receiving device 101 via the diode D1.

When this current is large, the trail affects the following pulse, thereby degrading the dynamic range of the current-to-voltage converting circuit 102. Also, an analog-to-digital converting circuit and the like to be connected at later stages may be caused to malfunction. Furthermore, if the discharge of the diode D1 takes a long time, a frequency response of the light receiver is deteriorated.

The diode D1 is necessary for clamping the transistor Q1. If the transistor Q1 is not clamped, the transistor Q1 is forced to depart from its operating point when the light receiving device 101 receives excessively intense light. This is because a large current flowing the light receiving device 101 levels down the base voltage of the transistor Q1 to the ground level.

2) The current amount flowing through the transistor Q1 is dependent on the power voltage and the resistor R1. That is, the current amount is in proportion to the power voltage. Thus, when the power voltage fluctuates, the current amount of the transistor Q1 is changed to bring about a change in frequency characteristics of the transistor Q1. The frequency characteristics of the transistor Q1 greatly affects the frequency characteristics of the light receiver. That is, the fluctuation of the power voltage has an effect on the frequency characteristics of the light receiver.

3) When the power voltage VCC is reduced below a certain voltage (voltage fall through the resistor R1+2Vbe+VF), the current-to-voltage converting circuit 102 does not operate any more. This undermines an effort of creating a light receiver with a low power voltage. Here, Vbe is a voltage between the base and the emitter in the transistor Q1 or Q2, and VF is a forward-direction voltage fall of the diode D1. Diodes and transistors are created by using the same junctions within the same chip, so that VF is nearly equal to Vbe.

Accordingly, there is a need for a current-to-voltage converting device and a light receiver which can convert a current into a voltage for a wide range of power voltages without losing the clamping function.

In the following, other embodiments of the present invention will be described with reference to the accompanying drawings.

Figure 17:
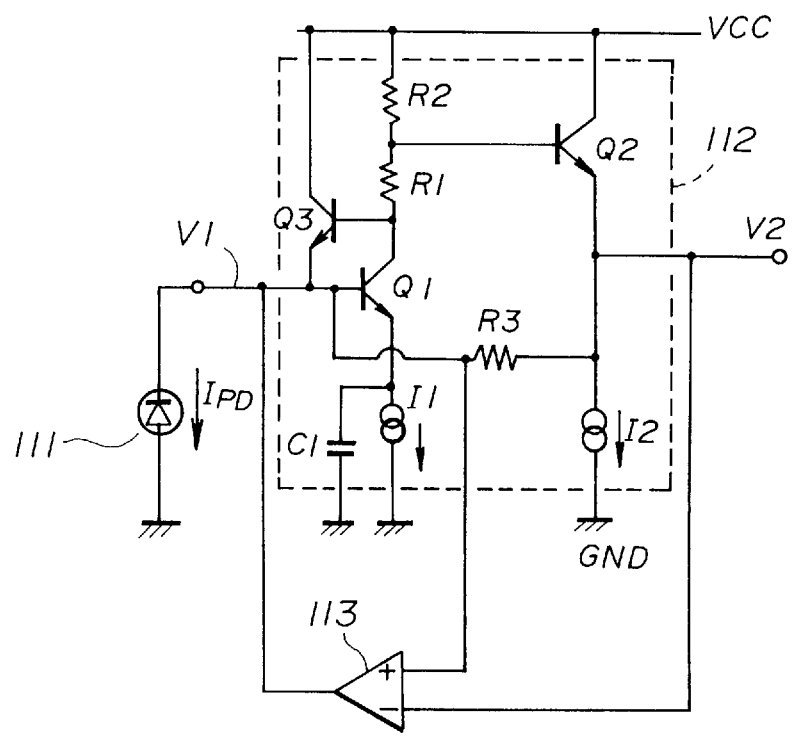
FIG. 17 is a circuit diagram of the light receiver according to a fifth embodiment of the present invention.
Figure 18A:
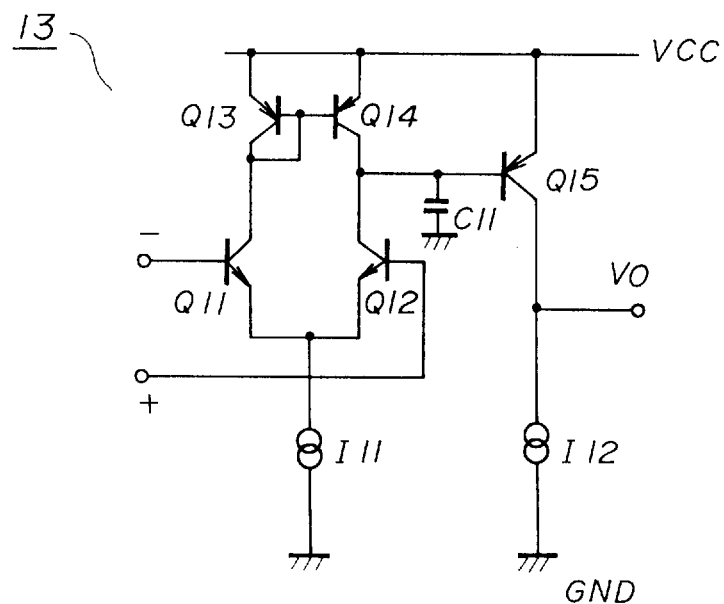
FIGS. 18A and 18B are circuit diagrams of a DC-feedback circuit used in the light receiver of FIG. 17.
Figure 18B:
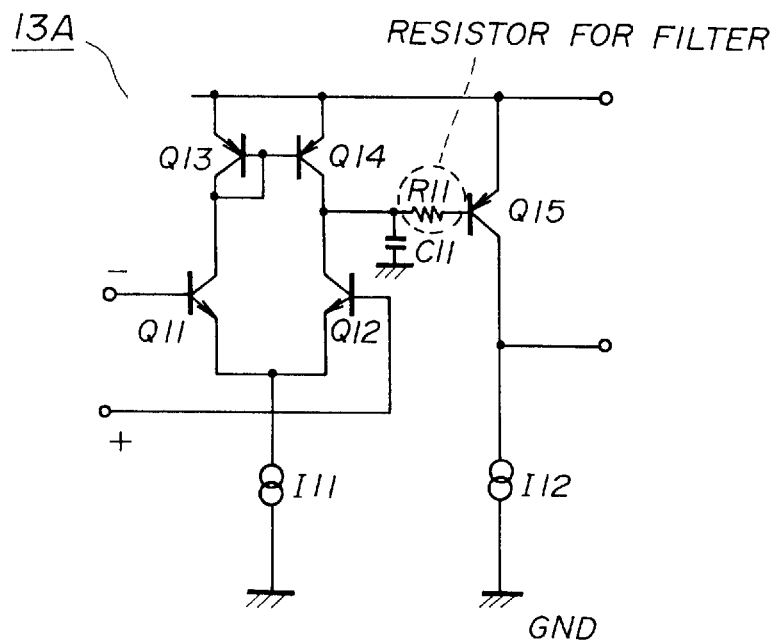

FIG. 17 is a circuit diagram of the light receiver according to a fifth embodiment of the present invention. FIGS. 18A and 18B are circuit diagrams of a DC-feedback circuit used in the light receiver of FIG. 17.

In FIG. 17, the light receiver includes a light receiving device 111, a current-to-voltage converting circuit 112, and a DC-voltage-feedback circuit 113. The light receiving device 111 is a photo diode, and receives light such as infrared light to generate a current. The light receiving device 111 utilizes the photoelectric effect to convert light into a current.

The current-to-voltage converting circuit 112 converts the current generated by the light receiving device 111 into a voltage. The current-to-voltage converting circuit 112 includes npn-type bipolar transistors Q1 through Q3, resistors R1 through R3, constant-current sources I1 and I2, and a capacitor C1.

The base of the transistor Q1 is connected to the light receiving device 111, to the emitter of the transistor Q3, and to one end of the resistor R3. The I collector of the transistor Q1 is coupled to the base of the transistor Q3 and to one end of the resistor R1. The emitter of the transistor Q1 is connected to the constant-current source I1 and to the ground via the capacitor C1. The capacitor C1 determines a lower cutoff frequency of the transistor Q1.

The other end of the resistor R1 is connected to the base of the transistor Q2 and one end of the resistor R2, the other end of which is coupled to the power voltage VCC. The resistor R2 is preferably set such that the transistor Q3 is cut off when there is no input for the transistor Q1.

The transistor Q2 has a collector connected to the power voltage VCC, and has an emitter connected to the other end of the resistor R3, the constant-current source I2, and an output node. The constant-current source I2 is coupled to the ground. The resistor R3 is called a trans-impedance.

The Transistor Q3 forms a clamp transistor with the collector thereof connected to the power voltage VCC. The transistor Q3 for clamping the transistor Q1 is turned on when the current Ipd flowing through the light receiving device 111 becomes large. The turn-on condition of the transistor Q3 is when the current Ipd becomes large, the collector current of the transistor Q1 is decreased, and the collector voltage is increased. When the transistor Q3 is turned on, a current is provided from the power voltage VCC to the light receiving device 111. Thus, the base voltage of the transistor Q1 is fixed to prevent a fall in the collector voltage.

The DC-voltage-feedback circuit 113 detects a voltage applied to the resistor R3 to adjust the base voltage of the transistor Q1. As shown in FIG. 18A, the DC-voltage-feedback circuit 113 includes a differential amplifier and an outputting circuit. The differential amplifier includes pnp-type bipolar transistors Q13 through Q15, npn-type bipolar transistors Q11 and Q12, constant-current sources I11 and I12, and a capacitor C11.

In FIG. 18A, the base of the transistor Q11 is connected to a negative input node, and the base of the transistor Q12 is connected to a positive input node. The emitters of the transistors Q1 and Q2 are connected to the constant-current source I11. The collectors of the transistors; Q11 and Q12 are coupled to the collectors of the transistors Q13 and Q14, respectively. The base of the transistor Q13 is connected with the base of the transistor Q14 and with the collector of the transistor Q11. The emitters of the transistors Q13 and Q14 are coupled to the power voltage VCC. The collector of the transistor Q14 is connected to the base of the transistor Q15 and to one end of the capacitor C11. The other end of the capacitor C11 is coupled to the ground. The emitter of the transistor Q15 is connected to the power voltage VCC, and the collector thereof is connected to the constant-current source I12 and an output node.

The DC-voltage-feedback circuit 113 keeps the base voltage of the transistor Q1 at a constant level to keep the output DC voltage constant.

In FIG. 18B, a DC-voltage-feedback circuit 113A is shown as a variation of the DC-voltage-feedback circuit 113. The DC-voltage-feedback circuit 113A is provided with a resistor R11. The resistor R11 and the capacitor C11 together form a low-pass filter. This low-pass filter determines a higher cut-off frequency of the DC-voltage-feedback circuit 113.

FIGS. 19A through 19C are time charts for showing an improved result of the fifth embodiment of the present invention. FIG. 19A shows the current Ipd. FIG. 19B shows the output voltage of the related-art light receiver of FIG. 16, and FIG. 19C shows the output voltage of the fifth-embodiment light receiver of FIG. 17.

FIG. 20 is a chart showing a frequency characteristic of the light receiver of the fifth embodiment. In FIG. 20, the ordinate shows a gain, and the abscissa shows a frequency with fL denoting the lower cut-off frequency. The light receiver passes signals having frequencies higher than fL.

In the following, an operation of the light receiver according to the fifth embodiment of the present invention will be described with reference to FIG. 17. When light repeatedly switching between on and off is received, for example, the current Ipd becomes a high level (H) or a low level (L) according to the on and off of the light.

When the current Ipd is not generated, the input voltage V1 and the output voltage V2 of the current-to-voltage converting circuit 112 has the same DC voltage. Here, the DC voltage of the input voltage V1 and the output voltage V2 is nearly equal to VCC−R2·I1−Vbe. This is the power voltage (VCC) minus the voltage fall through the resistor R2 (R2·I1) minus the voltage fall Vbe between the base and the emitter of the transistor Q2.

The emitter of the transistor Q1 has a DC voltage (V1−Vbe), which is the input voltage V1 minus the voltage fall Vbe between the base and the emitter in the transistor Q1. Since the emitter of the transistor Q1 is connected to the ground via the capacitor C1 for an alternate current, this transistor circuit is so called a grounded-emitter circuit.

The DC-voltage-feedback circuit 113 does not feed a control signal back to the input voltage V1 of the transistor Q1 because the input voltage V1 and the output voltage V2 are at the same level. The voltage fall Vbe between the base and the emitter in the transistor Q3 is greater than voltage fall Vbe between the base and the emitter in the other transistors Q1 and Q2. Thus, a collector current does not flow in the transistor Q3.

When the current Ipd is generated, the output voltage V2 of the current-to-voltage converting circuit 112 has a chance equal to a change in the current Ipd multiplied by R3. In this manner, the current-to-voltage conversion is achieved by using the resistor R3 as trans-impedance.

When the current Ipd flowing through the transistor Q1 is large, the collector current of the transistor Q1 becomes smaller to raise the collector voltage. Thus, the transistor Q3 takes a current in from the power voltage to clamp the transistor Q1. In this case, the output voltage V2 does not have the change equal to a change in the current Ipd multiplied by R3. Alternately, the output voltage V2 becomes VCC−R2·I1−Vbe. Here, V2 is the DC output of the current-to-voltage converting circuit 112, VCC is the power voltage, R2 is the resistance of the resistor R2, I1 is a current flowing through the transistor Q1, and Vbe is the voltage fall between the base and the emitter in the transistor Q2.

When the current Ips flowing through the transistor Q1 is changed from the high level to the low level, charge accumulated in the base of the transistor Q3 is taken out by the transistor Q1.

In the light receiver according to the fifth embodiment of the present invention, the charge accumulated in the base of the transistor Q3 is taken out by the transistor Q1 when the current Ipd changes from the high level to the low level. Thus, the output signal has a steeper fall in the voltage as shown in FIG. 19C compared to when the clamp diode is used.

Since the output signal has a steeper voltage fall, the light receiver can have a wider dynamic range. Also, an analog-to-digital converter and the like connected at the later stage can convert the voltage signal into binary data without an error.

Also, in the current-to-voltage converter of the present invention, the current amount flowing through the transistor Q1 is determined by the constant-current source I1. Thus, the collector current of the transistor Q1 can be kept constant even when the power voltage fluctuates. As a result, the frequency-response characteristics of the transistor Q1 is stabilized as well as the frequency-output characteristics of the light receiver.

Also according to the current-to-voltage converter of the present invention, the circuit can operate until the power voltage is lowered below a level of (R1+R2)+2·Vbe. Here, Vbe is the voltage fall between the base and the emitter in the transistor Q1 or Q2. Thus, the light receiver can be operated with lower power voltage.

In this manner, the light receiver having a wide dynamic range and capable of operating with a wide range of power voltages is obtained.

In the current-to-voltage converter of the fifth embodiment, the DC-voltage-feedback circuit 113 detecting the voltage applied between the two ends of the register R3 feeds this voltage back to the base of the transistor Q1. Thus, the base voltage is adjusted to cancel the DC offset, which may be caused by the ambient light, etc.

Also, the low-pass filter as shown in FIG. 18B may be provided to determine the higher cut-off frequency of the current-to-voltage converter as shown in FIG. 20.

Figure 21:
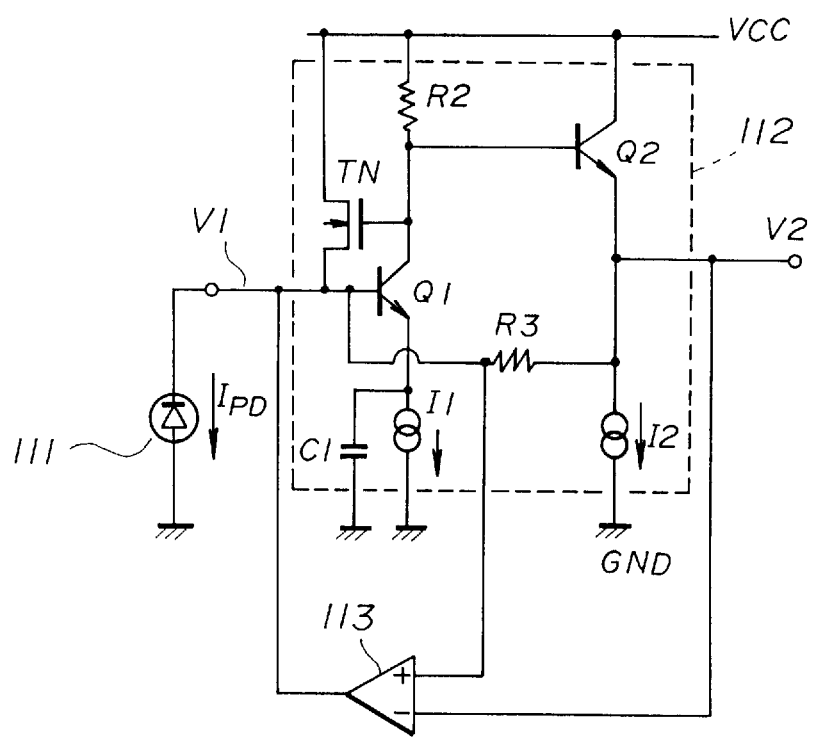
FIG. 21 is a circuit diagram of a light receiver according to a variation of the fifth embodiment of the present invention.

FIG. 21 is a circuit diagram of a light receiver according to a variation of the fifth embodiment of the present invention. As shown in FIG. 21, a field-effect transistor TN may be used as a clamp transistor, replacing the transistor Q3. The gate of the transistor TN is connected to the collector of the transistor Q1. The source of the transistor TN is connected to the base of the transistor Q1, and the drain is connected to the power voltage VCC. Then, the transistor TN is set such that it has a threshold value Vth larger than the voltage fall Vbe between the base and emitter in the transistor Q2.

In this case, the transistor TN can be turned on when the current Ipd is at such a high level as having a much larger magnitude than a normal magnitude. In this manner, the resistor R1 for determining the operating voltage of the transistor Q3 can be omitted to enhance the circuit density.

Figure 22:
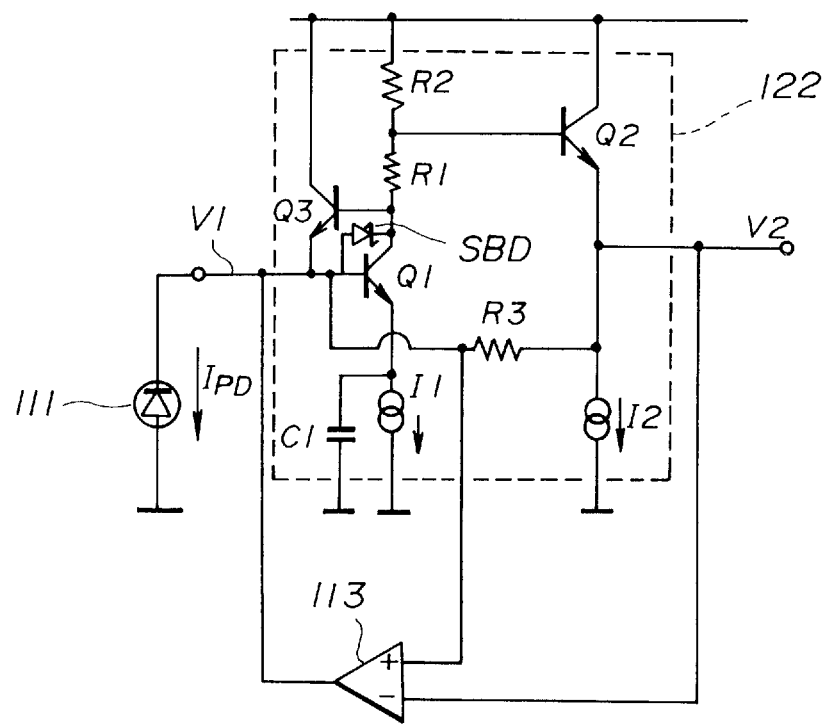
FIG. 22 is a circuit diagram of a light receiver according to a sixth embodiment of the present invention.

FIG. 22 is a circuit diagram of a light receiver according to a sixth embodiment of the present invention. The sixth embodiment differs from the fifth embodiment in that the current-to-voltage converting circuit is provided with a Schottky barrier diode. In FIG. 22, the same elements as those of FIG. 17 are referred to by the same numerals, and a description thereof will be omitted.

In FIG. 22, the light receiver includes a current-to-voltage converting circuit 122 for converting the current Ipd flowing through the light receiving device 111 into a voltage. The current-to-voltage converting circuit 122 includes a Schottky barrier diode SBD, which prevents the collector voltage of the transistor Q1 from falling by using the base voltage of the transistor Q1 as a reference voltage. The cathode of the SBD is connected to the collector of the transistor Q1, and the anode thereof is connected to the base of the transistor Q1.

In the light receiver according to the sixth embodiment of the present invention, the Schottky barrier diode SBD is provided between the base and the collector of the transistor Q1, so that the collector voltage can be prevented from falling based on the base voltage of the transistor Q1. As a result, even when the base input has a large magnitude, the collector voltage of the transistor Q1 is not reduced, thereby the circuit operation being stabilized.

Figure 23:
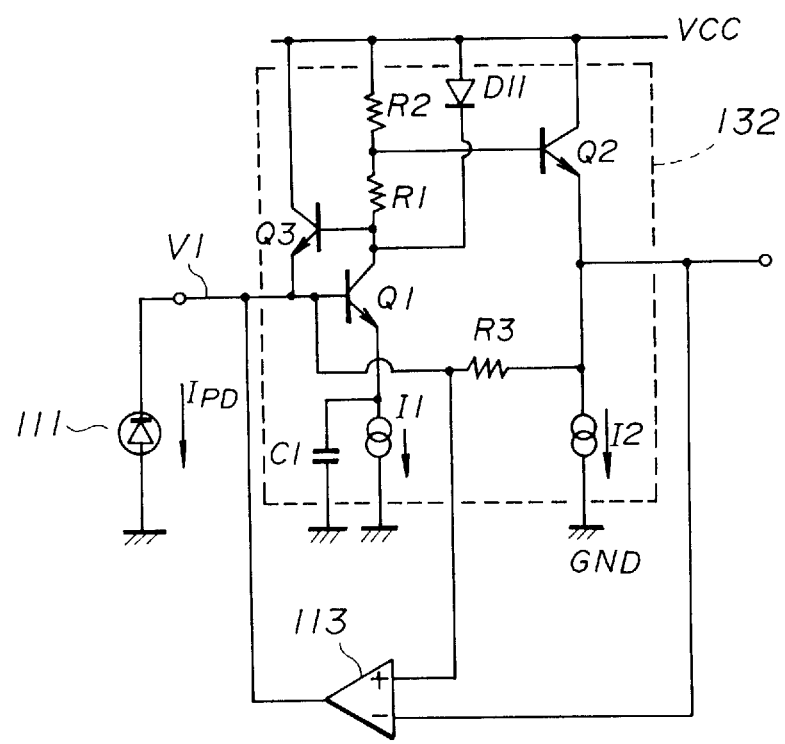
FIG. 23 is a circuit diagram of a light receiver according to a seventh embodiment of the present invention.

FIG. 23 is a circuit diagram of a light receiver according to a seventh embodiment of the present invention. The seventh embodiment differs from the fifth embodiment in that the current-to-voltage converting circuit is provided with a constant-voltage diode. In FIG. 23, the same elements as those of FIG. 17 are referred to by the same numerals, and a description thereof will be omitted.

In FIG. 23, the light receiver includes a current-to-voltage converting circuit 132 for converting the current Ipd flowing through the light receiving device 111 into a voltage. The current-to-voltage converting circuit 132 includes a diode D11, which prevents the collector voltage of the transistor Q1 from falling by using the power voltage VCC as a reference. The cathode of the diode D11 is connected to the collector of the transistor Q1, and the anode thereof is connected to the power voltage VCC.

In the light receiver according to the seventh embodiment of the present invention, the diode D11 is provided between the collector of the transistor Q1 and the power voltage VCC, so that the collector voltage can be prevented from falling based on the power voltage VCC. As a result, even when the base input has a large magnitude, the collector voltage of the transistor Q1 is not reduced, thereby the circuit operation being stabilized.

Figure 24:
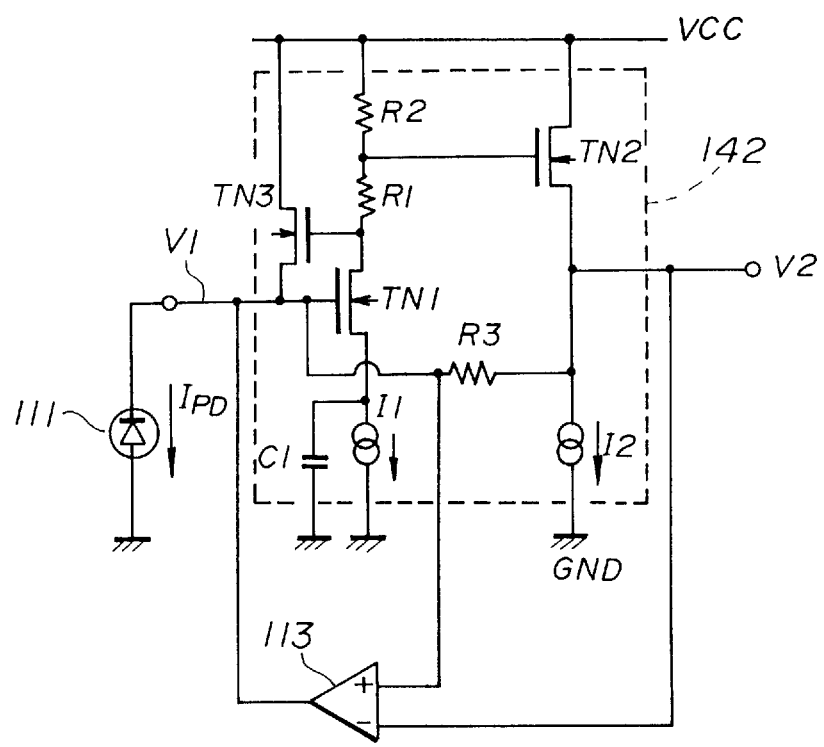
FIG. 24 is a circuit diagram of a light receiver according to an eighth embodiment of the present invention.

FIG. 24 is a circuit diagram of a light receiver according to an eighth embodiment of the present invention. The eighth embodiment differs from the first embodiment in that the current-to-voltage converting circuit uses n-type field-effect transistors instead of bipolar transistors. In FIG. 24, the same elements as those of FIG. 17 are referred to by the same numerals, and a description thereof will be omitted.

In FIG. 24, the light receiver includes a current-to-voltage converting circuit 142 for converting the current Ipd flowing through the light receiving device 111 into a voltage. The current-to-voltage converting circuit 142 includes field-effect transistors TN1 through TN3, the resistors R1 through R3, the constant-current sources I1 and I2, and the capacitor C1.

The transistor TN1 has a gate connected to the light receiving device 111, to the source of the transistor TN3, and to one end of the register R3 and has a drain connected to the gate of the transistor TN3 and to one end of the resistor R1. The source of the transistor TN1 is coupled to the constant-current source I1 and the capacitor C1. The constant-current source I1 and the capacitor C1 are connected to the ground.

The other end of the resistor R1 is connected to the gate of the transistor TN2 and to one end of the resistor R2. The other end of the resistor R2 is coupled to the power voltage VCC. Here, the resistor R2 is desirably set such that the transistor TN3 is cut off when there is no input to the transistor TN1.

The transistor TN2 has a drain coupled to the power voltage VCC, and has a source connected to the other end of the register R3 and to the constant-current source I2. The constant-current source I2 is connected to the ground.

The transistor TN3 serves as a clamp transistor in the same manner as in the fifth through seventh embodiments. The drain of the transistor TN3 is coupled to the power voltage VCC. The transistor TN3 for clamping the transistor TN1 is turned on when the current Ipd flowing through the light receiving device 111 becomes large. The turn-on condition of the transistor TN3 is when the gate voltage of the transistor TN1 is reduced, the drain current of the transistor TN1 is decreased, and the drain voltage is increased. When the transistor TN3 is turned on, a current is provided from the power voltage VCC to the light receiving device 111. Thus, the gate voltage of the transistor TN1 is fixed to prevent a fall in the drain voltage.

In the following, an operation of the light receiver according to the eighth embodiment of the present invention will be described. When there is no current Ipd, the current-to-voltage converting circuit 142 has the same DC voltage for the input voltage V1 and the output voltage V2. The DC voltage of the input voltage V1 and the output voltage V2 are the power voltage minus the voltage fall through the resistor R2 minus the threshold value of the transistor TN2, i.e., VCC−R2·I1−Vth.

The source voltage of the transistor TN1 becomes the input voltage V1 of the current-to-voltage converting circuit 142 minus the threshold value of the transistor TN1, i.e., V1−Vth. Also, the source of the transistor TN1 is grounded via the capacitor C1 for an alternate current. Thus, this transistor circuit is so called a grounded-source circuit.

The DC-voltage-feedback circuit 113 does not feed a control signal back to the input voltage V1 of the transistor TN1 because the input voltage V1 and the output voltage V2 are at the same level. The threshold value Vth of the transistor TN3 is greater than the threshold values Vth of the other transistors TN1 and TN2. Thus, unless a gate voltage higher than the gate voltages of the transistors TN1 and TN2 is applied to the transistor TN3, the transistor TN3 is not turned on. Thus, a drain current does not flow through the transistor TN3 in this case.

When the current Ipd is generated, the output voltage V2 of the current-to-voltage converting circuit 142 has a change equal to a change in the current Ipd multiplied by R3. In this manner, the current-to-voltage conversion is achieved by using the resistor R3 as trans-impedance.

The change in the current Ipd is represented as IpdH−IpdL, wherein IpdH is the current amount when the current Ipd is at the high level and IpdL is the current amount when the current Ipd is at the low level. Thus, the change in the output voltage V2 of the current-to-voltage converting circuit 142 can also be represented as R3×(IpdH−IpdL).

When the current Ipd flowing through the transistor TN1 is large, the drain current of the transistor TN1 becomes smaller to raise the drain voltage. Having a raised gate voltage, the transistor TN3 is turned on to take a current in from the power voltage VCC to clamp the transistor TN1. In this case, the output voltage V2 does not have the change equal to the change in the current Ipd multiplied by R3. Alternately, the output voltage V2 becomes VCC−R2·I1

−Vth. Here, V2 is the DC output of the current-to-voltage converting circuit 142, VCC is the power voltage, R2 is the resistance of the resistor R2, I1 is a current flowing through the transistor TN1, and Vth is the threshold value of the transistor TN2.

When the current Ips flowing through the transistor TN1 is changed from the high level to the low level, charge accumulated in the gate of the transistor TN3 is taken out through the drain of the transistor TN1.

In the light receiver according to the eighth embodiment of the present invention, the charge accumulated in the gate of the transistor TN3 is taken out by the transistor TN1 when the current Ipd changes from the high level to the low level. Thus, the output signal has a steep fall in the voltage as in the fifth embodiment.

Accordingly, as in the fifth embodiment, the current-to-voltage converting circuit 142 has a wide dynamic range. Also, an analog-to-digital converter and the like connected at the later stage can convert the voltage signal into binary data without an error.

Also, in the current-to-voltage converter of the present invention, the current amount flowing through the transistor TN1 is determined by the constant-current source I1. Thus, the drain current of the transistor TN1 can be kept constant even when the power voltage fluctuates. As a result, the frequency-response characteristics of the transistor TN1 is stabilized as well as the frequency-output characteristics of the light receiver.

Also, according to the current-to-voltage converter of the eighth embodiment of the present invention, the circuit can operate until the power voltage is lowered below a level of (R1+R2)+2·Vth. Thus, the light receiver can be operated with lower power voltage. Here, Vth is the threshold value of the transistors TN1 and TN2.

In this manner, the light receiver having a wide dynamic range and capable of operating with a wide range of power voltages is obtained. Also, since the current-to-voltage converting circuit 142 is comprised n-type-field-effect transistors TN1 through TN3, the circuit density can be enhanced.

Also, in the eighth embodiment, the threshold value Vth of the transistor TN3 can be set to a larger value than that of the transistor TN2 such that the transistor TN3 is turned on when the current Ipd has a magnitude much larger than the normal magnitude. In this manner, the resistor R1 for determining the operating voltage of the transistor TN3 may be omitted. Thus, a further enhancement in the circuit density can be achieved.

In the current-to-voltage converting circuit according to the fifth through eighth embodiments as described above, when the base input of the first transistor (Q1) is changed, the charge having accumulated in the base of the third transistor (Q3) is taken out by the first transistor. Thus, the output signal level falls with a steeper slope than the clamp diode is used. Thus, the dynamic range of the current-to-voltage converting circuit can be made wider.

Also, the Schottky barrier diode may be connected between the base and the collector of the first transistor. By using the base voltage of the first transistor as a reference, it is possible to prevent the collector voltage of the first transistor from falling.

Also, the diode may be connected between the collector of the first transistor and the power voltage. Thus, by using the power voltage as a reference, it is possible to raise the collector voltage of the first transistor. As a result, even when the base input of the first transistor has a large magnitude, the collector voltage of the first transistor does not fall, thereby the circuit operation being stabilized.

Also, the field-effect transistors may be used in the current-to-voltage converting circuit, thereby enhancing the circuit density.

Also, the light receiver having a wide dynamic range and capable of operating with a wide range of power voltages is obtained.

Further, the present invention is not limited to these embodiments, but various variations and modifications may be made without departing from the scope of the present invention.

What is claimed is:

1. A device converting a current pulse signal into a voltage pulse signal, comprising:
   a converting unit converting said current pulse signal into a first voltage signal;
   a voltage reducing unit and a delay unit respectively introducing a voltage reduction and a timing delay to said first voltage signal and thereby generating a second voltage signal having a reduced voltage and a delayed timing;
   a comparison unit generating said voltage pulse signal, as an output thereof, by comparing said first voltage signal with said second voltage signal, said comparison unit including:
      differential amplifier which amplifies a difference between said first voltage signal and said second voltage signal to generate an amplified difference signal, and
      a comparator which compares said amplified difference signal with a threshold voltage to generate said voltage pulse signal; and
   a feedback loop which cancels a direct current component at inputs of said differential amplifier by feeding back said amplified difference signal to said inputs of said differential amplifier.

2. The device as claimed in claim 1, wherein said comparison unit generates, as said output thereof, a voltage pulse signal of a first voltage level, when a voltage level of said first voltage signal is greater than that of said second voltage signal, and a voltage pulse signal of a second voltage level, when said voltage level of said first voltage signal is less than or equal to the voltage level of said second voltage signal.

3. The device as claimed in claim 1, wherein said voltage reducing unit comprises series-connected resistors, said first voltage signal being applied to said series-connected resistors and said second voltage signal of a reduced voltage being derived from a first connection node between two of said series-connected resistors.

4. The device as claimed in claim 1, wherein said delay unit comprises a capacitor.

5. The device as claimed in claim 4, wherein said delay unit comprises a capacitor connected in parallel to at least one resistor of said series-connected resistors at said first connection node.

6. The device as claimed in claim 3, wherein said delay unit comprises a further resistor and a capacitor, connected in series between said first connection-node and a fixed reference potential and having a second connection node therebetween, said second voltage signal being output from said second connection node.

7. The device as claimed in claim 1, wherein said delay unit outputs the second voltage signal.

8. The device as claimed in claim 5, further comprising a further delay circuit connected between said converting unit and said voltage reducing unit.

9. The device as claimed in claim 1, further comprising a circuit receiving an optical pulse signal and converting said optical pulse signal into said current pulse signal.

10. A device converting a current pulse input signal into a voltage pulse output signal, comprising:
- a converting unit converting said current pulse input signal into a first voltage signal and producing the first voltage signal as an output thereof;
- a voltage reducing and delay unit receiving the first voltage signal, output by the converting unit, and producing a second voltage signal, delayed in time and reduced in voltage relatively to the first voltage signal, as an output thereof;
- a comparison unit generating, as an output thereof, the voltage pulse output signal by comparing the first and second voltage signals, said comparison unit including a differential amplifier, which amplifies a difference between said first voltage signal and said second voltage signal to generate an amplified difference signal, and a comparator, which compares said amplified difference signal with a threshold voltage to generate said voltage pulse signal; and
- a feedback loop which cancels a direct current component at inputs of said differential amplifier by feeding back said amplified difference signal to said inputs of said differential amplifier.

* * * * *

UNITED STATES PATENT AND TRADEMARK OFFICE
CERTIFICATE OF CORRECTION

PATENT NO.: 5,804,997
DATED : September 8, 1998
INVENTOR(S): Kazunori NISHIZONO et al.

Figure 2D:
Figure 2E:
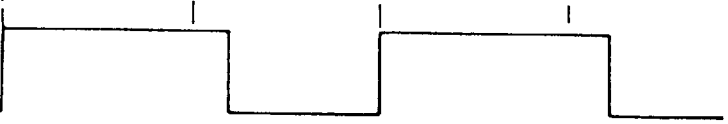
Figures 3A, 3B, 3C:
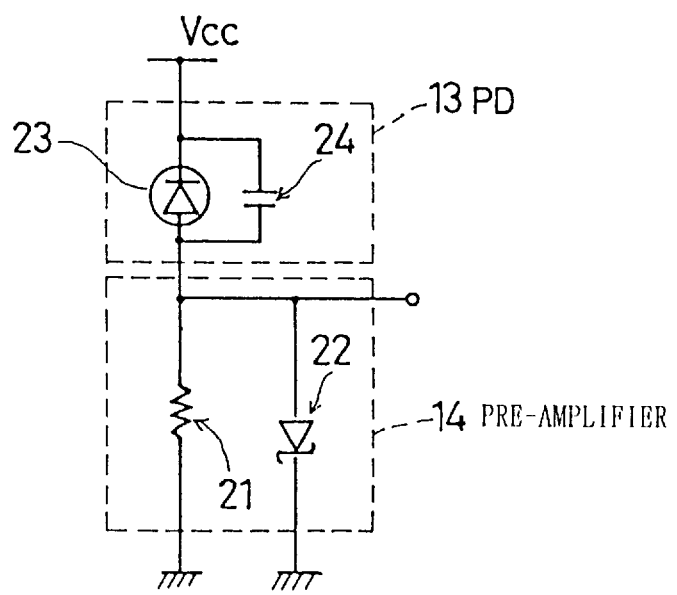
FIG. 3A is a circuit diagram of a simple model circuit of a pre-amplifier and a photo diode connected thereto in FIG. 1.
FIGS. 3B and 3C are time charts showing an optical signal received by the photo diode and a voltage generated by the pre-amplifier, respectively.
Figure 4:
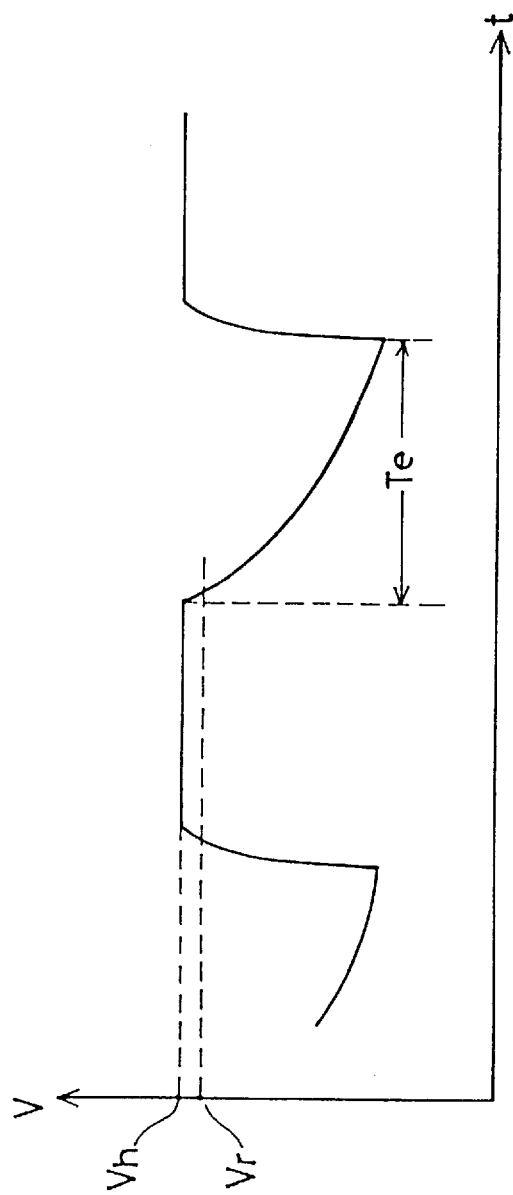
FIG. 4 is an enlarged view of the output signal of the pre-amplifier.

It is certified that error appears in the above-identified patent and that said Letters Patent is hereby corrected as shown below:

Col. 1,     line 28, after "FIG. 1" insert --.--;
          line 36, after "FIG. 2D" insert --.--.

Col. 2,     line 14, after "FIG. 2D" insert --.--.

Col. 5,     line 20, change "far" to --for--;
          line 36, change "arid" to --and--;
          line 62, delete "l".

Col. 6,     line 30, change "FIG."" to --FIGS.--.

Col. 7,     line 3, change "is" to --as--.

Col. 8,     line 13, delete "-";
          line 40, change "tc" to --to--;
          line 54, change "current-tovoltage" to --current-to-voltage--;
          line 67, change "VT1" to --V1--.

Col. 10,    line 23, delete "l";
          line 39, change "Transistor" to --transistor--;
          line 63, delete ";".

UNITED STATES PATENT AND TRADEMARK OFFICE
CERTIFICATE OF CORRECTION

PATENT NO.:    5,804,997
DATED     :    September 8, 1998
INVENTOR(S):   Kazunori NISHIZONO et al.

It is certified that error appears in the above-identified patent and that said Letters Patent is hereby corrected as shown below:

Col. 11,    line 58, change "chance" to --change--.

Col. 16,    line 56, delete "-".

Signed and Sealed this

Sixth Day of April, 1999

Attest:

Q. TODD DICKINSON

*Attesting Officer*    Acting Commissioner of Patents and Trademarks